United States Patent
Cucchi et al.

(10) Patent No.: US 6,995,593 B2
(45) Date of Patent: Feb. 7, 2006

(54) CIRCUIT FOR PROGRAMMABLE STEPLESS CLOCK SHIFTING

(75) Inventors: Silvio Cucchi, Gaggiano (IT); Paolo Novellini, Gorgonzola (IT)

(73) Assignee: Alcatel, Paris (FR)

( * ) Notice: Subject to any disclaimer, the term of this patent is extended or adjusted under 35 U.S.C. 154(b) by 56 days.

(21) Appl. No.: 10/720,195

(22) Filed: Nov. 25, 2003

(65) Prior Publication Data

US 2004/0164779 A1    Aug. 26, 2004

(30) Foreign Application Priority Data

Feb. 21, 2003   (EP) .................................. 03290424

(51) Int. Cl.
    *H03H 11/16*    (2006.01)
(52) U.S. Cl. ............... 327/238; 327/248; 327/254; 327/255; 375/298
(58) Field of Classification Search ............... 327/231, 327/233, 234, 237, 238, 248, 254, 255
    See application file for complete search history.

(56) References Cited

U.S. PATENT DOCUMENTS

| | | | | |
|---|---|---|---|---|
| 3,971,996 A | * | 7/1976 | Motley et al. ............... 327/233 |
| 4,638,190 A | * | 1/1987 | Hwang et al. ............... 327/237 |
| 4,833,479 A | * | 5/1989 | Carlson ....................... 342/194 |
| 4,970,519 A | * | 11/1990 | Minnis et al. ............... 342/165 |
| 5,404,405 A |  | 4/1995 | Collier et al. .................. 381/7 |
| 5,482,044 A | * | 1/1996 | Lin et al. ..................... 600/453 |
| 5,594,759 A |  | 1/1997 | Iwamatsu .................... 375/344 |
| 5,920,220 A | * | 7/1999 | Takao et al. ................. 327/233 |
| 6,239,387 B1 |  | 5/2001 | Wissell ........................ 174/262 |
| 6,417,712 B1 | * | 7/2002 | Beards et al. ............... 327/248 |
| 6,665,353 B1 | * | 12/2003 | Nisbet ......................... 375/302 |
| 6,677,795 B2 | * | 1/2004 | Itoh ............................. 327/202 |
| 2003/0042958 A1 | * | 3/2003 | Sanduleanu ................. 327/238 |

FOREIGN PATENT DOCUMENTS

| | | |
|---|---|---|
| DE | 39 03 944 A1 | 10/1990 |
| DE | 42 38 543 C1 | 5/1994 |
| EP | 0 501 740 A2 | 9/1992 |
| JP | 62-168407 | * 7/1987 |
| JP | 6-104738 | * 4/1994 |

* cited by examiner

*Primary Examiner*—Tuan T. Lam
(74) *Attorney, Agent, or Firm*—Sughrue Mion, PLLC

(57) ABSTRACT

The present invention provides for a circuit for programmable stepless clock shifting, consisting of a splitter generating a 0° and a 90° shifted clocks from a reference clock, and an interpolator of the two shifted clocks, which provides at the output the desired pre-set clock phase.

6 Claims, 1 Drawing Sheet

CIRCUIT FOR PROGRAMMABLE STEPLESS CLOCK SHIFTING

TECHNICAL FIELD

The present invention relates to a circuit for programmable stepless clock shifting.

This application is based on, and claims the benefit of, European Patent Application No. 03290424.5 filed on Feb. 21, 2003 which is incorporated by reference herein.

BACKGROUND OF THE INVENTION

In many electronic applications, for example digital CDRs (Clock Recovery Unit), it is required to generate a clock signal with a programmable phase shift with respect to a reference clock.

In a number of situations, when transferring data between different chips, boards or devices, the associated clock is usually not distributed. The main reason is pin count reduction and power saving. At the receiving end, the problem of recovering the associated clock arises, in order to sample and process the incoming data stream. The operation of phase aligning often cannot be avoided also when the associated clock signal is distributed along with the data signal.

It is possible to design a clock recovery circuit working without a reference clock under precise assumptions on the data pattern and the local VCO frequency tuning range. Since these hypothesis is often not met in the applications, the known solutions mainly require a reference clock frequency within a well defined tolerated range.

A number of known techniques are already available for generating a clock signal with a programmable phase shift, namely delay locked loops (DLL), phase locked loops (PLL), open loop delay lines, digital phase aligners (DPA).

PLL based solutions require considerable power and chip area and are generally not able to cope with a wide range data transition density or long CID (continuous identical digits) sequences, as often required by applications. Often a PLL is used to generate N phases of the reference clock. They are all distributed to each receiving macro in which one is selected in order to sample the incoming data. This solution requires a lot of area for the wiring. Besides, switching noise, variations in phase difference between the clock multiphases and duty cycle distortion become a challenging issue when covering a long path; in addition the mimimum distance in degrees between two adjacent phases is limited by the technology used for the chip.

In other proposed schemes, one PLL is used to generate one filtered clock phase which is then distributed to all the receiving macros. Locally all the phases are generated by means of a DLL. Power consumption and occupation area remain a severe issue. Also in these cases the mimimum distance in degrees between two adjacent phases is limited by the technology.

Cases in which the multi-phase clock is generated by means of an open loop delay line are also known. In this schemes, power consumption (all the phases are generated also if not used) is an issue. Moreover the whole algorithm is complicated because the phases do not cover 360° and the phase spacing is PTV (process, temperature and supply) dependent and limited.

Solutions that delay the data (digital phase aligners, DPA) are also known. The main drawback is that the delay chain length is supposed to cover the jitter tolerance amplitude and not only the clock period, which results in longer delay chains. This implies more eye closure and again a PTV dependent and limited phase spacing. Moreover, an architecture that delays the data requires the local availability of the exact transmitter clock frequency.

SUMMARY OF THE INVENTION

Therefore in view of the known solutions, that are not quite efficient, it is the main object of the present invention to provide a circuit for programmable stepless clock shifting solving all the above mentioned problems.

The basic idea of the present invention is to provide a programmable stepless clock shifter, consisting of a splitter generating a 0° and a 90° shifted clocks from a reference clock, and an interpolator of this two phases, which provides at the output the desired pre-set clock phase.

This object is achieved by a circuit for programmable stepless clock shifting comprising:

- a splitter, receiving a clock reference and generating two 90°-shifted clock phases;
- an interpolator receiving said two 90'-shifted clock phases and two coefficients, and supplying a programmable phase clock, which has a phase shift with respect to said clock reference that depends only on said two coefficients.

BRIEF DESCRIPTION OF THE DRAWINGS

The invention will become fully clear from the following detailed description, given by way of a mere exemplifying and non limiting example, to be read with reference to the attached drawing, wherein the single FIGURE shows a block diagram of the circuit in accordance with the invention.

BEST MODE FOR CARRYING OUT THE INVENTION

Figure 1:
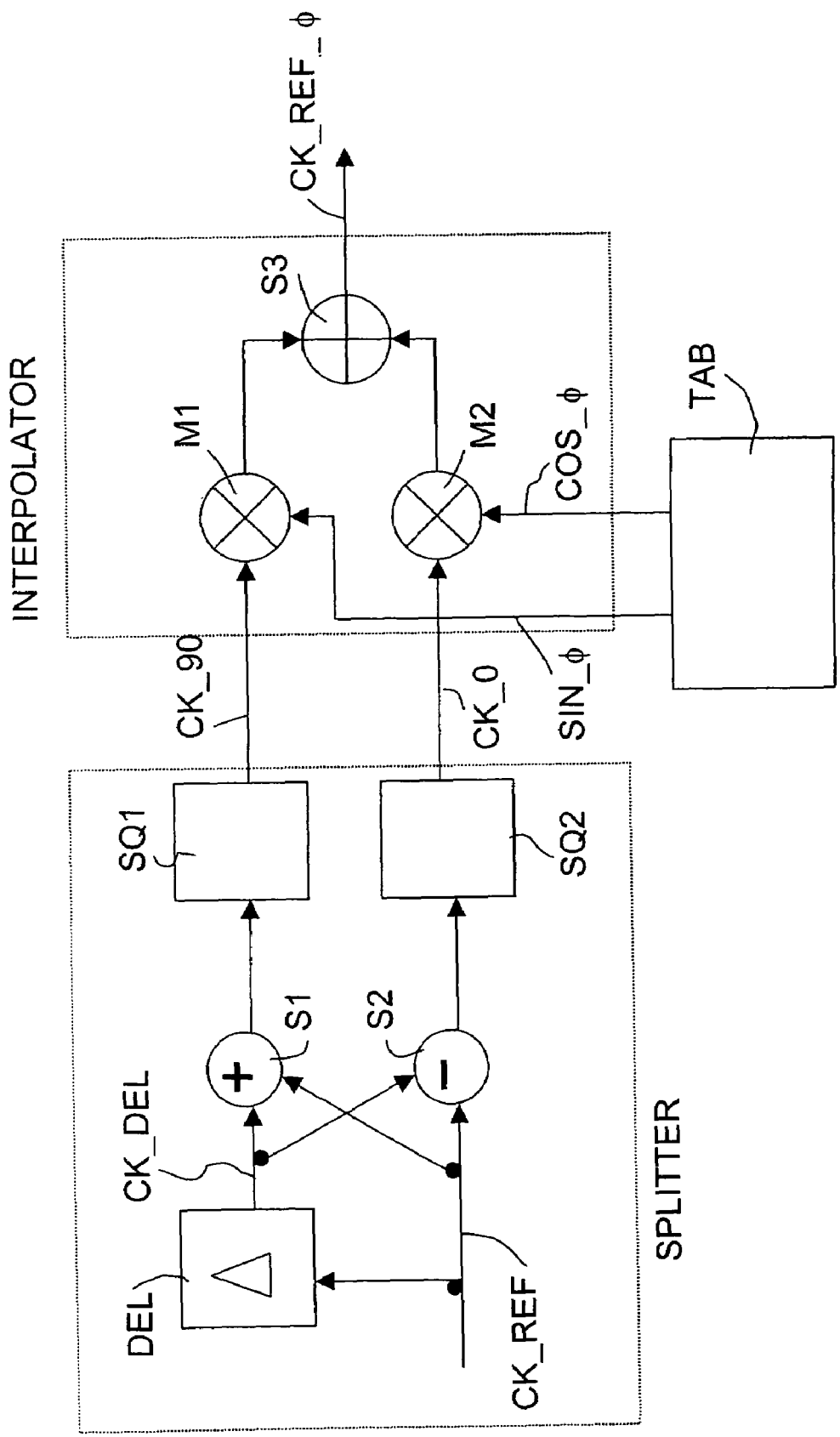

As shown in the FIGURE, the solution consists of two blocks in series, a splitter (SPLITTER) and an interpolator (INTERPOLATOR): the splitter receives a clock CK_REF and generates two clock phases, 90° shifted; the interpolator uses these two clock phases and two coefficients SIN_Φ and COS_Φ, and produces a clock, which has a phase that depends only on the input coefficients.

A detailed description of the two blocks is given in the following.

SPLITTER. The input clock CK_REF is summed (in the adder S1) and substracted (in the subtractor S2) to a delayed clock CK_DEL supplied by a delaying circuit DEL. It is possible to show analitically or graphically that the two clocks at the outputs of S1 and S2 are 90° shifted for construction, independently on the value of delay $\Delta$ as soon as the following condition on the delay is met:

$$\Delta \neq \pi + k\pi, \ k=\{0, \pm 1, \pm 2, \ldots \}$$

This means that the vectorial product of the input clock CK_REF and the delayed clock CK_DEL should not be zero. In the applications this condition is easily met.

Typically the value of $\Delta$ is 90°±50%.

When the input clock CK_REF and the delayed clock CK_DEL are orthogonal, that means shifted exactly by 90° each other, the output amplitudes of S1 and S2 are equal. In the other cases two squarers SQ1 and SQ2 are encharged to output two clocks CK_90 and CK_0 with the same amplitude. In practice in the circuit implementation the two squarers are ever present to ensure output amplitude uniformity.

INTERPOLATOR. This block receives the two 90° shifted clocks CK_90 and CK_0 from the splitter and provides a clock with a phase that is programmable by setting two appropriate input coefficients.

The working principle relies on the following trigonometric relation:

$$\sin(\omega t+\Phi)=\sin(\omega t)\cos\Phi+\cos(\omega t)\sin\Phi$$

By summing two 90° shifted clock phases, $\sin(\omega t)$ and $\cos(\omega t)$, with appropriate coefficients, $\cos\Phi$ and $\sin\Phi$, it is possible to obtain any delayed version $\sin(\omega t+\Phi)$, of the input reference clock $\sin(\omega t)$.

In the circuit the two 90° shifted clocks CK_90 and CK_0 are sent to respective inputs of two multipliers M1 and M2; the second input of M1 is supplied with a first coefficient SIN_$\Phi$ and the second input of M2 with a second coefficient COS_$\Phi$.

The outputs of M1 and M2 are supplied to the inputs of an adder S3 wich gives at the output the wanted clock reference CK_REF_$\Phi$ with the pre-set phase difference $\Phi$ with respect to the input clock CK_REF.

The two coefficients SIN_$\Phi$ and COS_$\Phi$ are selected in any wanted way. For example they can come from a memory table TAB suitably addressed, according to the wanted phase shift a, which can be any.

The advantages of the present invention are clear.

The minimum angle between two adjacent phases is not technology nor temperature nor supply dependent. The resolution can be chosen as high as needed (stepless clock shifter).

The solution is open loop, so it does not require a careful design of the loop in order to grant stability. When used in CDRs, no minimum data transition density has to be defined.

A monolitic chip implementation, for example a VLSI technology, takes advantage of the low power consumption and the low silicon area required. No filter has to be implemented.

Further implementation details will not be described, as the man skilled in the art is able to carry out the invention starting from the teaching of the above description.

Many changes, modifications, variations and other uses and applications of the subject invention will become apparent to those skilled in the art after considering the specification and the accompanying drawings which disclose preferred embodiments thereof. All such changes, modifications, variations and other uses and applications which do not depart from the spirit and scope of the invention are deemed to be covered by this invention.

What is claimed is:

1. A circuit for programmable stepless clock shifting comprising:
   a splitter, receiving a clock reference and generating two 90°-shifted clock phases, said; splitter comprising a delay circuit receiving said clock reference and supplying a delayed clock; an adder and a subtractor of said clock reference and said delayed clock, supplying at the output said two 90°-shifted clock phases, and two squarers for squaring said two 90°-shifted clock phases, so that said two 90°-shifted clock phases have the same amplitude as one another; and
   an interpolator receiving said two 90°-shifted clock phases from said squarers and two coefficients, and supplying a programmable phase clock, which has a phase shift with respect to said clock reference that depends only on said two coefficients.

2. A circuit according to claim 1 wherein the delay introduced by said delay circuit is typically $\Delta=90°\pm50\%$, and is $$\Delta\neq\pi+k\pi,\ k=\{0,\pm1,\pm2\ldots\}.$$

3. A circuit according to claim 1, wherein said interpolator comprises:
   a first and second multiplier, respectively receiving one of said two 90°-shifted clock phases and a first and second coefficient; and
   an adder receiving the outputs of said first and second multiplier and supplying said programmable phase clock.

4. A circuit according to claim 3, wherein said first and second coefficients have a value of respectively $\sin\Phi$ and $\cos\Phi$, such that the following relationship is performed:

$$\sin(\omega t+\Phi)=\sin(\omega t)\cos\Phi+\cos(\omega t)\sin\Phi$$

where
   $\Phi$ is said programmable phase of the programmable phase clock;
   $\sin(\omega t+\Phi)$ is the frequency of said programmable phase clock; and
   $\sin(\omega t)$ and $\cos(\omega t)$ are the frequencies of said two 90°-shifted clock phases.

5. A circuit according to claim 3, wherein said first and second coefficients are selected from a memory table, addressed according to the desired programmable phase.

6. A circuit according to claim 4, wherein said first and second coefficient are selected from a memory table, addressed according to the desired programmable phase.

* * * * *